United States Patent
Kao et al.

(10) Patent No.: US 11,756,936 B2
(45) Date of Patent: *Sep. 12, 2023

(54) BACKSIDE CONTACT TO IMPROVE THERMAL DISSIPATION AWAY FROM SEMICONDUCTOR DEVICES

(71) Applicant: Taiwan Semiconductor Manufacturing Company, Ltd., Hsin-Chu (TW)

(72) Inventors: Min-Feng Kao, Chiayi (TW); Dun-Nian Yaung, Taipei (TW); Hsing-Chih Lin, Tainan (TW); Jen-Cheng Liu, Hsin-Chu (TW); Yi-Shin Chu, Hsinchu (TW); Ping-Tzu Chen, Tainan (TW); Che-Wei Chen, Kaohsiung (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 17/703,088

(22) Filed: Mar. 24, 2022

(65) Prior Publication Data

US 2022/0216185 A1 Jul. 7, 2022

Related U.S. Application Data

(63) Continuation of application No. 16/898,613, filed on Jun. 11, 2020, now Pat. No. 11,289,455.

(51) Int. Cl.
*H01L 25/065* (2023.01)
*H01L 21/768* (2006.01)
(Continued)

(52) U.S. Cl.
CPC .... *H01L 25/0657* (2013.01); *H01L 21/76895* (2013.01); *H01L 21/76898* (2013.01);
(Continued)

(58) Field of Classification Search
CPC ........... H01L 25/0657; H01L 21/76895; H01L 23/53228; H01L 24/08; H01L 21/76898;
(Continued)

(56) References Cited

U.S. PATENT DOCUMENTS

2014/0035128 A1 2/2014 Chou et al.
2018/0175266 A1* 6/2018 England ................. H01L 24/05
(Continued)

OTHER PUBLICATIONS

R. L. de Orio. "Dual-Damascene Fabrication Process." The date of publication is unknown. Retrieved online on Jul. 30, 2019 from www.iue.tuwien.ac.at/phd/orio/node10.html.
(Continued)

*Primary Examiner* — Mamadou L Diallo
(74) *Attorney, Agent, or Firm* — Eschweiler & Potashnik, LLC

(57) ABSTRACT

In some embodiments, the present disclosure relates to a 3D integrated circuit (IC) stack that includes a first IC die bonded to a second IC die. The first IC die includes a first semiconductor substrate, a first interconnect structure arranged on a frontside of the first semiconductor substrate, and a first bonding structure arranged over the first interconnect structure. The second IC die includes a second semiconductor substrate, a second interconnect structure arranged on a frontside of the second semiconductor substrate, and a second bonding structure arranged on a backside of the second semiconductor substrate. The first bonding structure faces the second bonding structure. Further, the 3D IC stack includes a first backside contact that extends from the second bonding structure to the backside of the
(Continued)

second semiconductor substrate and is thermally coupled to at least one of the first or second interconnect structures.

20 Claims, 13 Drawing Sheets

(51) Int. Cl.
   *H01L 23/48*      (2006.01)
   *H01L 23/532*     (2006.01)
   *H01L 23/00*      (2006.01)

(52) U.S. Cl.
   CPC ...... *H01L 23/481* (2013.01); *H01L 23/53228* (2013.01); *H01L 23/53257* (2013.01); *H01L 24/05* (2013.01); *H01L 24/08* (2013.01); *H01L 2224/05624* (2013.01); *H01L 2224/05684* (2013.01); *H01L 2224/08146* (2013.01); *H01L 2225/06541* (2013.01)

(58) Field of Classification Search
   CPC . H01L 23/481; H01L 24/05; H01L 23/53257; H01L 2224/05624; H01L 2225/06541; H01L 2224/08146; H01L 2224/05684
   See application file for complete search history.

(56) References Cited

U.S. PATENT DOCUMENTS

| | | | |
|---|---|---|---|
| 2019/0295989 A1 | 9/2019 | Yu et al. | |
| 2019/0363079 A1* | 11/2019 | Thei | H01L 24/06 |
| 2020/0035560 A1* | 1/2020 | Block | H01L 21/8221 |
| 2020/0135617 A1* | 4/2020 | Shen | H01L 23/53214 |
| 2020/0235073 A1* | 7/2020 | Chen | H01L 24/92 |
| 2020/0266146 A1* | 8/2020 | Nishida | H01L 23/5283 |
| 2020/0328186 A1* | 10/2020 | Liu | G11C 11/005 |
| 2020/0411636 A1* | 12/2020 | Kao | H01L 28/91 |
| 2021/0013303 A1* | 1/2021 | Chen | H01L 25/18 |
| 2021/0028148 A1* | 1/2021 | Wu | H01L 21/7682 |
| 2021/0082873 A1* | 3/2021 | Chen | H01L 24/03 |

OTHER PUBLICATIONS

Wikipedia.org "Copper Interconnects." Published on Jun. 25, 2019.
Wikipedia.org "Diffusion Barrier." Published on Jan. 11, 2019.
Wikipedia.org. "Three-Dimensional Integrated Circuit." Published on Jul. 25, 2019.
Decharat et al. "Room-Temperature Sealing of Microcavities by Cold Metal Welding." IEEE Journal of Microelectromechanical Systems, vol. 18, No. 6, Dec. 2009.
Chen et al. "Investigation on Seal-Ring Rules for IC Product Reliability in 0.25-m CMOS Technology." Microelectronics Reliability 45 (Sep.-Nov. 2005), pp. 1311-1316.
Non-Final Office Action dated Jun. 30, 2021 for U.S. Appl. No. 16/898,613.
Notice of Allowance dated Nov. 24, 2021 for U.S. Appl. No. 16/898,613.

* cited by examiner

BACKSIDE CONTACT TO IMPROVE THERMAL DISSIPATION AWAY FROM SEMICONDUCTOR DEVICES

REFERENCE TO RELATED APPLICATION

This Application is a Continuation of U.S. application Ser. No. 16/898,613, filed on Jun. 11, 2020, the contents of which are hereby incorporated by reference in their entirety.

BACKGROUND

The semiconductor industry continues to improve the integration density of various electronic components (e.g., transistors, diodes, resistors, capacitors, etc.) by, for example, reducing minimum feature sizes, which allows more components to be integrated into a given area. Smaller package structures, that utilize less area or smaller heights, are developed to package the semiconductor devices. For example, to further increase circuit density per area, three-dimensional (3D) integrated circuits (ICs) have been investigated.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
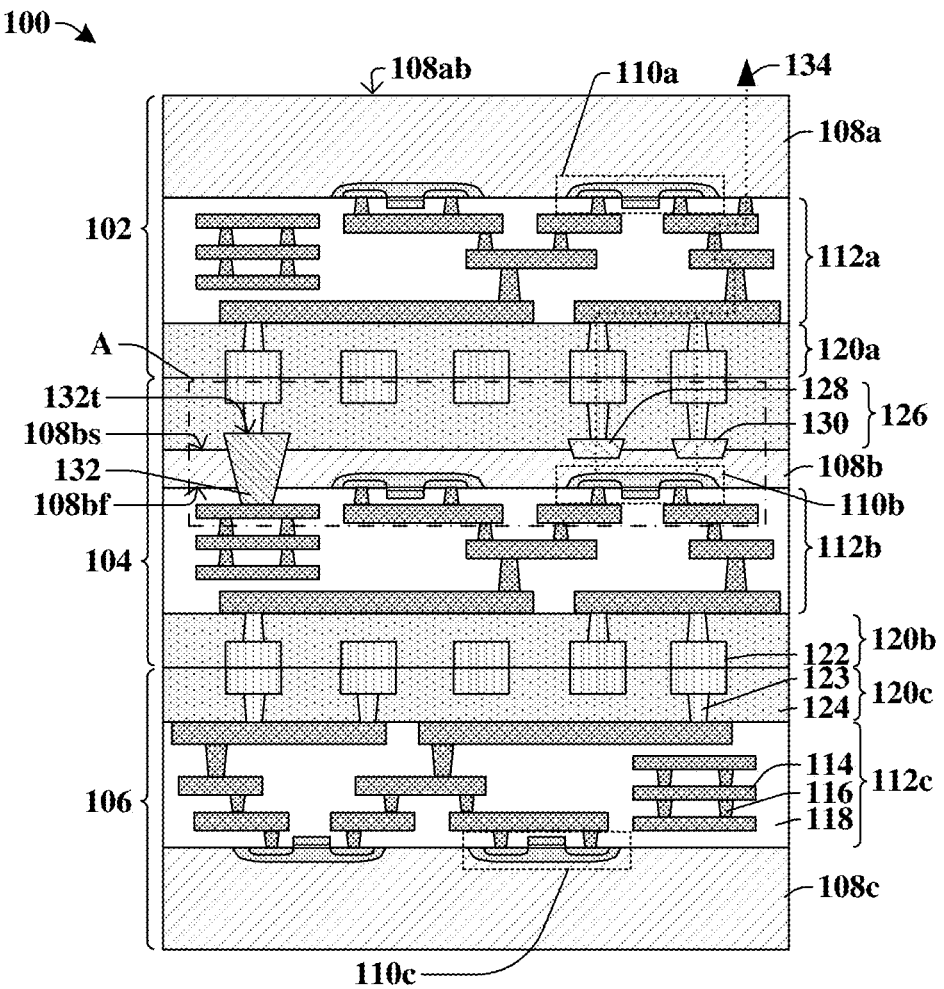
FIG. 1 illustrates a cross-sectional view of a three-dimensional (3D) integrated circuit (IC) stack comprising a second IC die arranged between and bonded to a first IC die and a third IC die, wherein the second IC die comprises a backside contact.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

A three-dimensional (3D) integrated circuit (IC) may include a first IC die bonded to a second IC die. The first and second IC dies may each comprise a semiconductor substrate, a semiconductor device integrated on the semiconductor substrate, and an interconnect structure comprising conductive wires and vias embedded in a dielectric structure. In some embodiments, the first IC die comprises a first bonding structure, and the second IC die comprises a second bonding structure. The first IC die and the second IC die may be bonded to one another through the first bonding structure and the second bonding structure. If the first IC die and the second IC die are bonded in at least a front-to-back (F2B) or in a back-to-back (B2B) orientation, heat generated from the semiconductor device of the first IC die and/or from the semiconductor device of the second IC die may become trapped due to insufficient heat dissipation by surrounding dielectric layers. In some embodiments, the trapped heat may be concentrated in the semiconductor substrates of the first and/or second IC dies and may damage the first and/or second IC dies. Further, if a 3D IC comprises more than two IC dies with similar or same designs (e.g., size/position of semiconductor device(s), interconnect structure, etc.), heat build-up in the semiconductor substrates of the IC dies may be even greater and thus, more damaging to the 3D IC.

In some embodiments, to facilitate thermal dissipation away from the semiconductor substrates and the semiconductor devices, the first and/or second IC die may comprise a through substrate via (TSV). In some embodiments, the TSV also electrically couples the first IC die to the second IC die. However, the TSV takes up a large area on a semiconductor substrate, and thus, increasing a number of TSVs in an IC die to improve heat dissipation would reduce the number of other semiconductor devices (e.g., transistors) that could be integrated on the semiconductor substrate and/or require a change in the existing layout of 3D ICs.

Various embodiments of the present disclosure present a 3D IC comprising a first IC die vertically bonded to a second IC die. In some embodiments, the second IC die comprises a second semiconductor device arranged on a frontside of a second semiconductor substrate, and a backside contact arranged on a backside of the second semiconductor substrate. When the backside of the second semiconductor substrate is arranged above the frontside of the second semiconductor substrate, the backside contact may be arranged directly above the second semiconductor device to increase heat dissipation away from the second semiconductor device. The backside contact may be arranged far enough away from the second semiconductor device to avoid electrical interference with the second semiconductor device. In some embodiments, the backside contact has a topmost surface that is below topmost surfaces of any TSVs on the second semiconductor substrate when the backside of the second semiconductor substrate is above the frontside of the second semiconductor substrate. Thus, the backside contact does not increase the vertical dimensions of the 3D IC. Additionally, the backside contact does not interfere with the existing layout of the second semiconductor device on the second semiconductor substrate. Further, in some embodiments, the backside contact is coupled to an interconnect structure of the first and/or second IC die. Thus, during operation of the second semiconductor device on the second semiconductor substrate, generated heat may dissipate through the backside contact and away from the second semiconductor device, thereby preventing heat build-up and eventual performance degradation of the 3D IC.

FIG. 1 illustrates a cross-sectional view 100 of some embodiments of a three-dimensional (3D) integrated circuit (IC) stack comprising a backside contact.

The 3D IC stack of the cross-sectional view 100 includes a first IC die 102, a second IC die 104 arranged below the first IC die 102, and a third IC die 106 arranged below the second IC die 104. Thus, in some embodiments, the second IC die 104 may be arranged between and bonded to the first IC die 102 and the third IC die 106. Each of the first, third, and second IC dies 102, 104, 106 comprise a semiconductor substrate, a semiconductor device (e.g., transistor, capacitor, diode, etc.) on a frontside of the semiconductor substrate, an interconnect structure arranged over the frontside of the semiconductor substrate and the semiconductor device, and a bonding structure arranged over the interconnect structure and the frontside of the semiconductor substrate. For example, the first IC die 102 comprises a first substrate 108a, a first semiconductor device 110a, a first interconnect structure 112a, and a first bonding structure 120a; the second IC die 104 comprises a second substrate 108b, a second semiconductor device 110b, a second interconnect structure 112b, and a second bonding structure 120b; and the third IC die 106 comprises a third substrate 108c, a third semiconductor device 110c, a third interconnect structure 112c, and a third bonding structure 120c. In some embodiments, more than one of the semiconductor devices (110a, 110b, 110c) may be arranged on each of the substrates (108a, 108b, 108c). Each of the interconnect structures (e.g., 112a, 112b, 112c) may comprise a network of interconnect wires 114 and interconnect vias 116 surrounded by an interconnect dielectric structure 118. The network of interconnect wires 114 and interconnect vias 116 of the first interconnect structure 112a, the second interconnect structure 112b, and the third interconnect structure 112c are electrically coupled to the first semiconductor device 110a, the second semiconductor device 110b, and the third semiconductor device 110c, respectively. In some embodiments, each of the first, second, and third bonding structures 120a, 120b, 120c may comprise bonding vias 123 and bonding wire layers 122 embedded within a bonding dielectric structure 124. In some embodiments, the bonding structures (e.g., 120a, 120b, 120c) may be, for example, hybrid bond (HB) structures. In some embodiments, the second bonding structure 120b is bonded to the third bonding structure 120c, and the first bonding structure 120a is bonded to an additional bonding structure 126 of the second IC die 104.

In some embodiments, the additional bonding structure 126 of the second IC die 104 may also be a HB structure, for example. In some embodiments, the additional bonding structure 126 may comprise bonding vias 123, bonding wire layers 122, interconnect vias 116, and/or interconnect wires 114 embedded within the bonding dielectric structure 124. The additional bonding structure 126 is disposed on a backside 108bs of the second substrate 108b of the second IC die 104. A through substrate via (TSV) 132 may extend from the backside 108bs to a frontside 108bf of the second substrate 108b, in some embodiments. The TSV 132 may be electrically coupled to the second interconnect structure 112b and to conductive components (e.g., interconnect wires 114, interconnect vias 116, bonding wire layers 122, bonding vias 123) of the additional bonding structure 126. Thus, the TSV 132 may comprise a first material that is electrically conductive and thus, electrically couples the first, second, and/or third IC dies 102, 104, 106 to one another, in some embodiments.

In some embodiments, the additional bonding structure 126 may further comprise a first backside contact 128. The first backside contact 128 may extend from a bonding via 123 of the additional bonding structure 126 towards the backside 108bs of the second substrate 108b. In some embodiments, the first backside contact 128 extends into the backside 108bs of the second substrate 108b. In some embodiments, when the backside 108bs of the second substrate 108b is facing in an "up" direction (i.e., the backside 108bs is above the frontside 108bf of the second substrate 108b), as in the cross-sectional view 100 of FIG. 1, the first backside contact 128 may be arranged directly over one of the second semiconductor devices 110b. Further, the first backside contact 128 may be spaced apart from active areas of the second semiconductor device(s) 110b to avoid electrical interference with the second semiconductor device 110b. In some embodiments, the first backside contact 128 is coupled to the first interconnect structure 112a of the first IC die 102 through the first bonding structure 120a and the additional bonding structure 126. In some embodiments, the additional bonding structure 126 may also comprise a second backside contact 130. In some embodiments, the second backside contact 130 may be laterally spaced apart from the first backside contact 128. In some embodiments, the first and second backside contacts 128, 130 may comprise a second material that is different than the first material of the TSV 132. Further, in some embodiments, the first and second backside contacts 128, 130 may be arranged below a topmost surface 132t of the TSV 132 when the backside 108bs of the second substrate 108b is facing in an "up" direction. Thus, the addition of the first and second backside contacts 128, 130 in the additional bonding structure 126 may not increase the vertical dimensions of the second IC die 104. In some embodiments, the first and/or second backside contacts 128, 130 may be formed before the formation of the TSV 132 such that the first and/or second backside contacts 128, 130 do not extend above the topmost surface 132t of the TSV 132.

It will be appreciated that during operation of the first semiconductor device 110a heat may be generated, and the generated heat may dissipate away from the first semiconductor device 110a and out of the 3D IC stack through a backside 108ab of the first substrate 108a. Further, it will be appreciated that during operation of the second semiconductor device 110b, heat may be generated. Thus, in some embodiments, a heat dissipation path 134 may include the first and/or second backside contacts 128, 130 that are arranged near the second semiconductor device 110b to allow any heat within the second substrate 108b to dissipate away from the second semiconductor device 110b and out of the second substrate 108b. Generated heat may travel along the heat dissipation paths 134 along the bonding wire layers 122, the bonding vias 123 of the first bonding structure 120a and the additional bonding structure 126; along the interconnect wires 114 and interconnect vias 116 of the first interconnect structure 112a; and finally dissipate out of the 3D IC stack through at least the first substrate 108a.

Thus, the heat travels faster through the bonding wire layers 122, the bonding vias 123, the interconnect wires 114, and the interconnect vias 116 than through the bonding dielectric structures 124 or the interconnect dielectric structures 118. Because the first and second backside contacts 128, 130 are arranged in closer proximity to the second semiconductor device 110b than the TSV 132 and because the first and second backside contacts 128, 130 have a higher thermal conductivity than the TSV 132, heat will dissipate more quickly into the first and second backside contacts 128, 130 than into the TSV 132. Therefore, the heat dissipation paths 134 that include the first and/or second backside contacts 128, 130 are more efficient than a heat dissipation path (not shown) that includes the TSV 132. In other words, in some embodiments, the heat dissipations paths 134 that include the first and/or second backside contacts 128, 130 do not include the TSV 132. Thus, the first and/or second backside contacts 128, 130 may provide a more efficient heat dissipation path 134 to reduce thermal degradation to the 3D IC stack, thereby improving the lifetime of the 3D IC stack without increasing the dimensions and/or changing the layout of the 3D IC stack.

Figure 2:
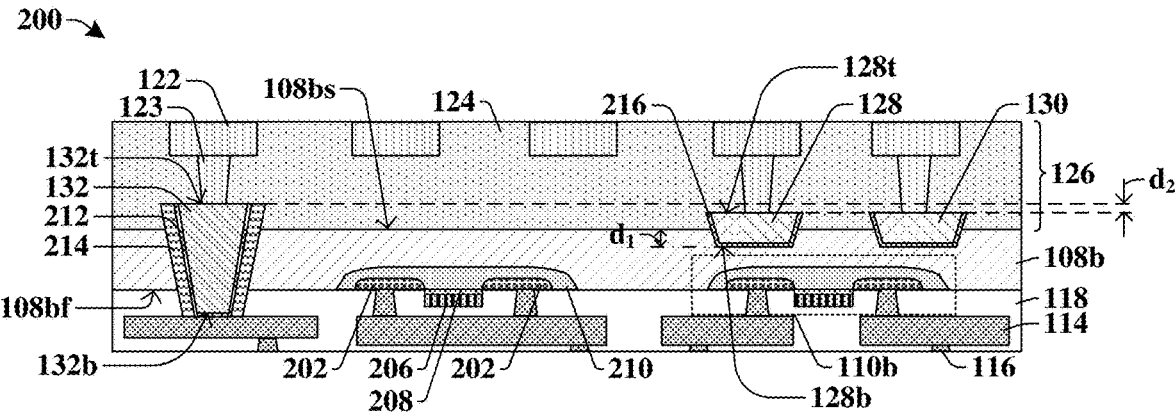
FIGS. 2-4 illustrate cross-sectional views of some alternative embodiments of a backside contact arranged on a backside of a substrate and over a semiconductor device.

FIG. 2 illustrates a cross-sectional view 200 of some embodiments that correspond to box A in the cross-sectional view 100 of FIG. 1 to highlight features of the first and second backside contacts 128, 130, the TSV 132, and the second semiconductor device 110b, in some embodiments.

In some embodiments, the first and second backside contacts 128, 130 may each be surrounded by a glue layer 216 to promote adhesion between the between the first and second backside contacts 128, 130 and the second substrate 108b. In some embodiments, the first and second backside contacts 128, 130 may comprise, for example tungsten, and the glue layer 216 may comprise, for example, titanium or titanium nitride. In some embodiments, the glue layer 216 may have a thickness in a range of between, for example, approximately 20 angstroms and approximately 300 angstroms. In some embodiments, the glue layer 216 separates the first and/or second backside contacts 128, 130 from directly contacting the second substrate 108b.

In some embodiments, the TSV 132 may also be surrounded by one or more layers. For example, in some embodiments, the TSV 132 comprises a TSV lining 214 that surrounds sidewalls of the TSV 132. In some embodiments, the TSV lining 214 comprises a dielectric material (e.g., silicon nitride, silicon dioxide) to prevent the TSV 132 from electrically leaking into the second substrate 108b and near the second semiconductor device 110b. In some embodiments, the TSV lining 214 may have a thickness in a range of between, for example, approximately 200 angstroms and approximately 2000 angstroms. In some embodiments, a bottommost surface 132b and the topmost surface 132t of the TSV 132 may be uncovered by the TSV lining 214 to allow electrical signals to travel through the TSV 132 from the bottommost surface 132b to the topmost surface 132t such that the TSV 132 is electrically coupled to at least the second interconnect structure (112b of FIG. 1). Further, in some embodiments, the TSV 132 may be in direct contact with a chemical barrier layer 212 to prevent the TSV 132 from chemically leaking (e.g., diffusing) into the second substrate 108b. In some embodiments, the chemical barrier layer 212 may comprise, for example, tantalum nitride. In some embodiments, the chemical barrier layer 212 may have a thickness in a range of between, for example, approximately 50 angstroms and approximately 500 angstroms. In some embodiments, the chemical barrier layer 212 may be arranged directly on the bottommost surface 132b of the TSV 132.

In some embodiments, the second semiconductor device 110b may be, for example, a metal oxide semiconductor field effect transistor (MOSFET). In such example embodiments, the second semiconductor device 110b may comprise a doped well region 210 within the second substrate 108b, wherein the doped well region 210 is more heavily doped and/or has a different doping type than the second substrate 108b. Source/drain regions 202 may reside in the doped well region 210, and a gate electrode 206 over a gate dielectric layer 208 may be arranged on the frontside 108bf of the second substrate 108b. The first backside contact 128 may have a bottommost surface 128b, which may be defined by a bottommost surface of the glue layer 216, that is spaced apart from the second semiconductor device 110b such that the first backside contact 128 does not electrically interfere with the second semiconductor device 110b. Therefore, in some embodiments, the glue layer 216 and the first backside contact 128 contact an area of the second substrate 108b that has a different doping concentration and/or different doping type than active areas (e.g., doped well region 210, source/drain regions 202) of the second semiconductor device 110b in the second substrate 108b. In some embodiments, the bottommost surface 128b of the first backside contact 128 extends into the backside 108bs of the second substrate 108b by a first distance $d_1$. In some embodiments, the first distance $d_1$ may be in a range of between approximately 100 angstroms and approximately 700 angstroms, for example.

Further, in some embodiments, the topmost surface 128t of the first backside contact 128 is arranged below the topmost surface 132t of the TSV 132 by a second distance $d_2$. Thus, the first backside contact 128 takes up less space than a TSV 132. For example, the TSV 132 penetrates through the entire second substrate 108b, whereas the first backside contact 128 penetrates the second substrate 108b by the first distance $d_1$. Thus, n some embodiments, the bottommost surface 128b of the first backside contact 128 is arranged above the bottommost surface 132b of the TSV 132. Further, the topmost surface 132t of the TSV 132 is higher than the topmost surface 128t of the first backside contact 128. Thus, the first backside contact 128 does not increase the vertical dimensions of the overall 3D IC stack. Further, in some embodiments, the TSV 132 comprises copper and the first backside contact 128 comprises tungsten. Thus, in some embodiments, the first backside contact 128 has a higher thermal conductivity than the TSV 132 and is more effective at removing heat away the one or more second semiconductor devices 110b in the second substrate 108b than the TSV 132.

Figure 3:
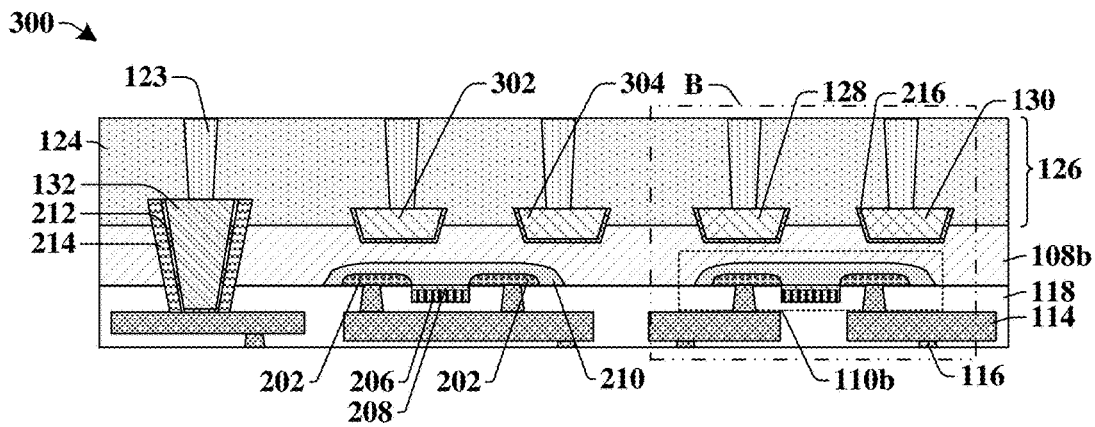

FIG. 3 illustrates a cross-sectional view 300 of some alternative embodiments of the cross-sectional view 200 of FIG. 2.

As illustrated in the cross-sectional view 300 of FIG. 3, in some embodiments, more than one or two backside contacts (e.g., 128, 130) may be arranged on the second substrate 108b. For example, in some embodiments, a first backside contact 128 and a second backside contact 130 are arranged directly over a first one of the second semiconductor devices 110b on the second substrate 108b, and a third backside contact 302 and a fourth backside contact 304 are arranged over a second one of the second semiconductor devices 110b on the second substrate 108b. In some other embodiments, more or less than two backside contacts may be arranged over a semiconductor device. Nevertheless, by increasing the number of backside contacts (e.g., 128, 130, 302, 304) on the second substrate 108b, heat generated by the second semiconductor device(s) 110b may have more heat dissipation paths (e.g., 134 of FIG. 1) to travel through such that the heat to dissipates away from the second semiconductor device(s) 110b.

Further, as shown in FIG. 3, in some embodiments, the additional bonding structure 126 may include bonding vias 123 and not bonding wire layers (122 of FIG. 2). In such embodiments, by omitting bonding wire layers (122 of FIG. 2), some steps, and thus, time and costs, of the manufacturing process may be reduced. However, in such embodiments, bonding the additional bonding structure 126 to, for example, the first bonding structure (120a of FIG. 1) may be less reliable because the bonding vias 123 have a smaller surface area for bonding than the bonding wire layers (122 of FIG. 2).

Figure 4:
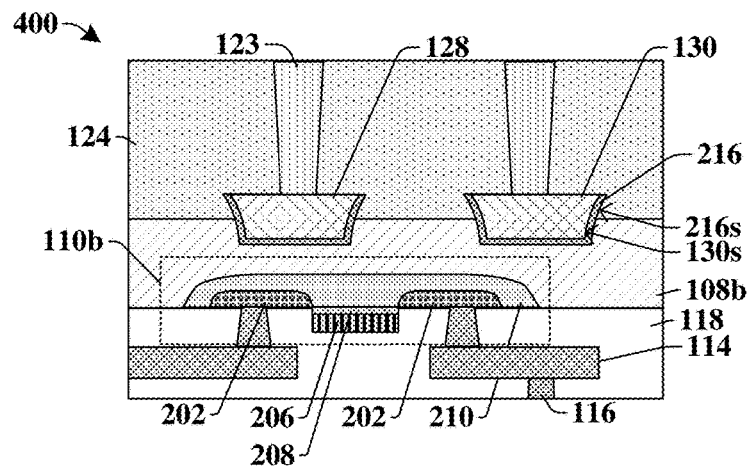

FIG. 4 illustrates a cross-sectional view 400 of some embodiments that correspond to box B in the cross-sectional view 300 of FIG. 3 to highlight alternative features of the first and second backside contacts 128, 130, in some embodiments.

As shown in FIG. 4, in some embodiments, the first and/or second backside contacts 128, 130 may have substantially curved outer sidewalls. For example, in some embodiments, the second backside contact 130 may have an outermost sidewall 130s that is substantially curved. In such embodiments, an outermost sidewall 216s of the glue layer 216 that surrounds the second backside contact 130 may also be substantially curved.

Figure 5:
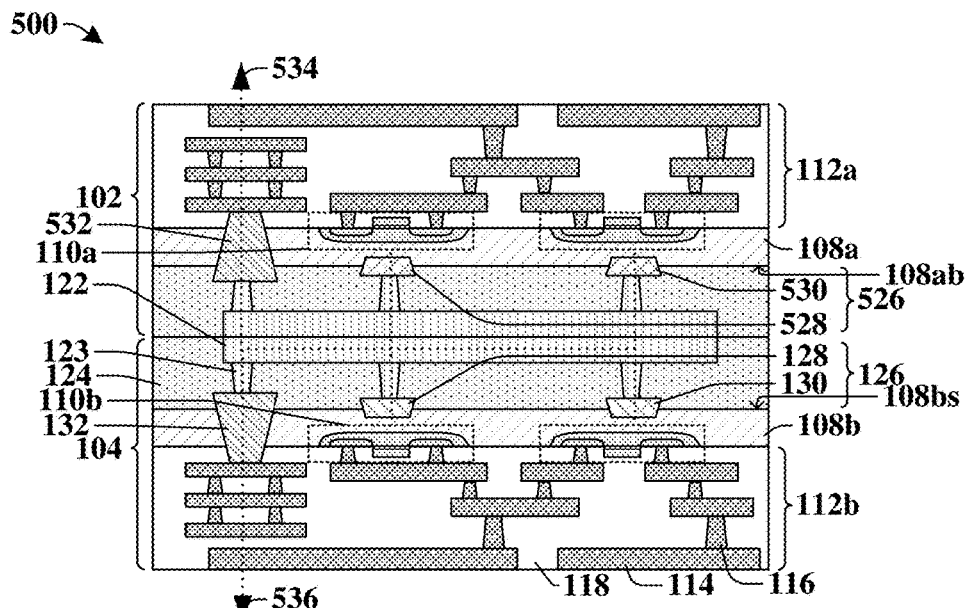
FIGS. 5 and 6 illustrates cross-sectional views of some embodiments of a 3D IC stack comprising a first IC die arranged over and bonded to a second IC die, wherein the first and/or second IC dies comprise backside contacts.

FIG. 5 illustrates a cross-sectional view 500 of some other embodiments of a 3D IC stack comprising a backside contact, wherein the 3D IC stack comprises a backside of a first IC die bonded to a backside of a second IC die.

As shown in FIG. 5, in some embodiments, a backside 108ab of the first substrate 108a of the first IC die 102 may face the backside 108bs of the second substrate 108b of the second IC die 104. In some embodiments, the additional bonding structure 126 is arranged on the backside 108bs of the second substrate 108b and bonded to a second additional bonding structure 526 arranged on the backside 108ab of the first substrate 108a. In such embodiments, the second additional bonding structure 526 may include a third backside contact 528 and/or a fourth backside contact 530 that extend into the backside 108ab of the first substrate 108a. Further, in some embodiments, the first IC die 102 may comprise a first additional TSV 532 that extends completely through the first substrate 108a. In such embodiments, for heat to dissipate away from the first and second semiconductor devices 110a, 110b during operation, the first through fourth backside contacts 128, 130, 528, 530 may be coupled to the TSV 132 and/or the first additional TSV 532 such that a first heat dissipation path 534 may be directed through the first interconnect structure 112a and that a second heat dissipation path 536 may be directed through the second interconnect structure 112b. In some embodiments, the first and/or second interconnect structures 112a, 112b may be coupled to other IC dies, external bonding contacts, or some other device. It will be appreciated that in such embodiments, if the first through fourth backside contacts 128, 130, 528, 530 were not coupled to the first and/or second interconnect structures 112a, 112b through the TSV 132 and/or the first additional TSV 532, any heat generated from the first and/or second semiconductor devices 110a, 110b would not be able to effectively dissipate away from the first and/or second semiconductor devices 110a, 110b and thus, the generated heat may damage the first and/or second semiconductor devices 110a, 110b.

Figure 6:
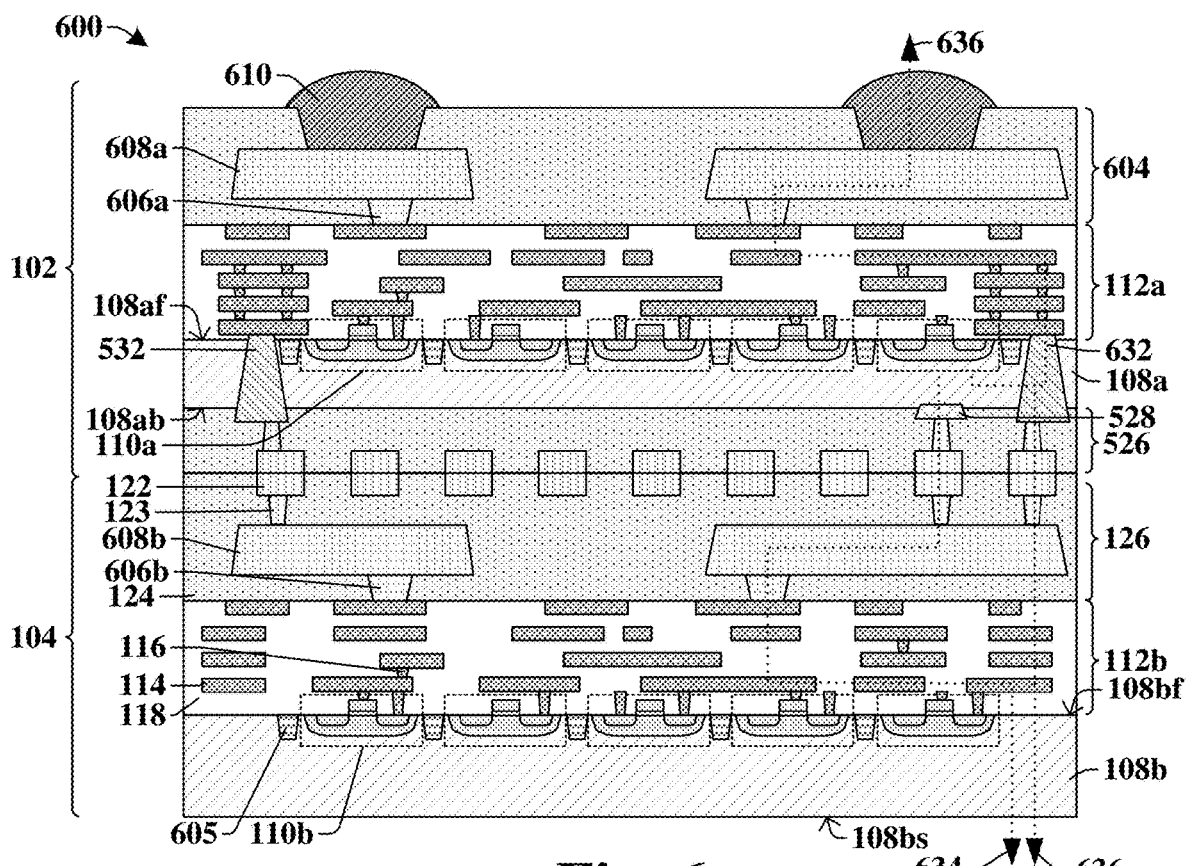

FIG. 6 illustrates a cross-sectional view 600 of yet some other embodiments of a 3D IC stack comprising a backside contact, wherein the 3D IC stack comprises a backside of a first IC die bonded to a frontside of a second IC die.

As shown in FIG. 6, in some embodiments, the backside 108ab of the first substrate 108a may face the frontside 108bf of the second substrate 108b. In such embodiments, the second interconnect structure 112b may be arranged over the frontside 108bf of the second substrate 108b, and the additional bonding structure 126 may be arranged over the second interconnect structure 112b. In some embodiments, multiple second semiconductor devices 110b may be arranged on the second substrate 108b and laterally spaced apart by isolation structures 605. For example, in some embodiments the isolation structures 605 may be or comprise shallow trench isolation (STI) structures.

In some embodiments, the additional bonding structure 126 of the second IC die 104 may further comprise second bond pads 608b and second bond pad vias 606b. In such embodiments, the second bond pads 608b and the second bond pad vias 606b may comprise a same or a different conductive material than the bonding wire layers 122, the bonding vias 123, the interconnect vias 116, and/or the interconnect wires 114. For example, in some embodiments, the second bond pads 608b and the second bond pad vias 606b comprise aluminum, copper, or some other suitable conductive material. Further, in some embodiments, the bonding wire layers 122, the bonding vias 123, the interconnect vias 116, the interconnect wires 114, the TSV 132 and/or the first additional TSV 532 may comprise copper or some other suitable conductive material. In some embodiments, the third backside contact 528 arranged on the backside 108ab of the first substrate 108a may comprise tungsten or some other suitable electrically and thermally conductive material.

Further, the second additional bonding structure 526 of the first IC die 102 may be arranged on the backside 108ab of the first substrate 108a, in some embodiments, and the second additional bonding structure 526 is bonded to the additional bonding structure 126. In such embodiments, heat generated by the second semiconductor device(s) 110b may escape through the backside 108bs of the second substrate 108b. Further, in some embodiments, the first IC die 102 may be electrically coupled to the second IC die 104 through a first additional TSV 532 and/or a second additional TSV 632, wherein the first additional TSV 532 and the second additional TSV 632 extend completely through the first substrate 108a. In some embodiments, the first interconnect structure 112a may be arranged on the frontside 108af of the first substrate 108a, and an upper bonding structure 604 may be arranged over and coupled to the first interconnect structure 112a. In such embodiments, the upper bonding structure 604 may comprise first bond pads 608a and first bond pad vias 606a embedded within the bonding dielectric structure 124 of the upper bonding structure 604. In some embodiments, solder bumps 610 may be arranged over the first bond pads 608a such that the first and second IC dies 102, 104 may be coupled to some external feature (e.g., printed circuit board, another IC die, wires, etc.).

In some embodiments, the first semiconductor devices 110a in the first substrate 108a are surrounded by the second additional bonding structure 526 and the first interconnect structure 112a. In such embodiments, the third backside contact 528 may be arranged on the backside 108ab of the first substrate 108a to promote heat dissipation away from the first semiconductor devices 110a. In some embodiments, through, for example, a first heat dissipation path 634 and a second heat dissipation path 636, generated heat from the first semiconductor device(s) 110*a* may dissipate away from the first semiconductor device(s) 110*a*. In some embodiments, heat may dissipate along the first heat dissipation path 634 that includes the third backside contact 528 and not the second additional TSV 632. In some embodiments, heat may dissipate along the second heat dissipation path 636 that includes the second additional TSV 632 and not the third backside contact 528. In other embodiments, heat may dissipate through the third backside contact 528 and the second additional TSV 632 by way of some other heat dissipation path (not shown). In some embodiments, the second heat dissipation path 636 may allow heat to escape through the second substrate 108*b* or through the solder bumps 610. In some embodiments, the solder bumps 610 may comprise aluminum, copper, or some other suitable conductive material.

Because the third backside contact 528 comprises a material that has a higher thermal conductivity than the second additional TSV 632, heat is more likely to travel through the first heat dissipation path 634 than the second heat dissipation path 636. Thus, the third backside contact 528 increases the efficiency of heat dissipation, and increasing the number of backside contacts on the first substrate 108*a* will further increase the efficiency of heat dissipation away from the first semiconductor devices 110*a*.

FIGS. 7-22 illustrate cross-sectional views 700-2200 of some embodiments of a method of forming a backside contact on a backside of a substrate and directly over a semiconductor device within the substrate. Although FIGS. 7-22 are described in relation to a method, it will be appreciated that the structures disclosed in FIGS. 7-22 are not limited to such a method, but instead may stand alone as structures independent of the method.

Figure 7:
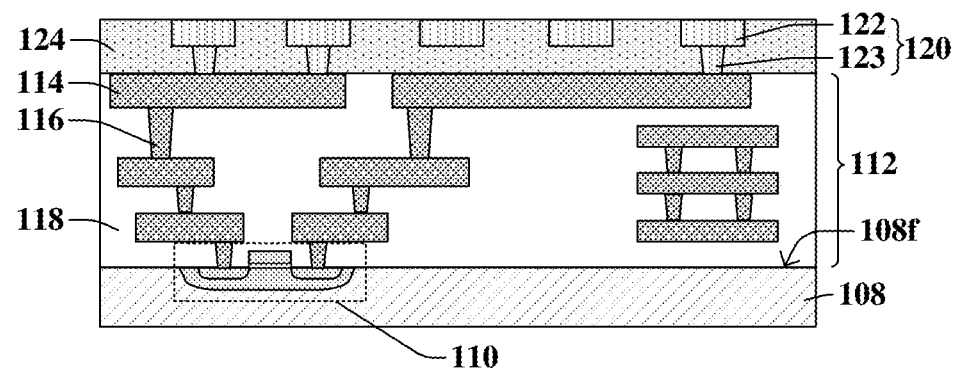
FIGS. 7-22 illustrate cross-sectional views of some embodiments of a method of forming a backside contact on a backside of a substrate prior to forming a through substrate via that extends completely through the substrate.

As shown in cross-sectional view 700 of FIG. 7, a semiconductor substrate 108 is provided. In some embodiments, the semiconductor substrate 108 may comprise any type of semiconductor body (e.g., silicon/CMOS bulk, SiGe, SOI, etc.) such as a semiconductor wafer or one or more die on a wafer, as well as any other type of semiconductor and/or epitaxial layers formed thereon and/or otherwise associated therewith. In some embodiments, the semiconductor substrate 108 may have a thickness in a range of between, for example, approximately 2.4 micrometers and approximately 3 micrometers. On a frontside 108*f* of the semiconductor substrate 108, a semiconductor device 110 may be deposited. In some embodiments, the semiconductor device 110 may be, for example, a transistor, a capacitor, a resistor, or the like. An interconnect structure 112 may be deposited over the semiconductor device 110 and on the frontside 108*f* of the semiconductor substrate 108, the interconnect structure 112 comprising interconnect vias 116 and interconnect wires 114 embedded within an interconnect dielectric structure 118. In some embodiments, the interconnect structure 112 may have a thickness in a range of between, for example, approximately 5 micrometers and approximately 8 micrometers.

In some embodiments, the interconnect vias 116 and interconnect wires 114 comprise a same material that is conductive. For example, in some embodiments, the interconnect vias 116 and interconnect wires 114 comprise copper. In other embodiments, the interconnect vias 116 and interconnect wires 114 may comprise other conductive materials such as, for example, tungsten, aluminum, or the like. In some embodiments, the interconnect dielectric structure 118 may comprise a dielectric material, such as, for example, a nitride (e.g., silicon nitride, silicon oxynitride), a carbide (e.g., silicon carbide), an oxide (e.g., silicon oxide), borosilicate glass (BSG), phosphoric silicate glass (PSG), borophosphosilicate glass (BPSG), a low-k oxide (e.g., a carbon doped oxide, SiCOH), or the like. Further, a bonding structure 120 may be formed over the interconnect structure 112. In some embodiments, the bonding structure 120 may comprise bonding vias 123 and bonding wire layers 122 embedded within a bonding dielectric structure 124. In some embodiments, the bonding vias 123, the bonding wire layers 122, and the bonding dielectric structure 124 comprise the same materials as the interconnect vias 116, the interconnect wires 114, and the interconnect dielectric structure 118, respectively. In some embodiments, the interconnect wires 114 may be coupled to the bonding vias 123. In some embodiments, the bonding structure 120 may have a thickness is a range of between, for example, approximately 1.5 micrometers and approximately 2 micrometers.

Figure 8:
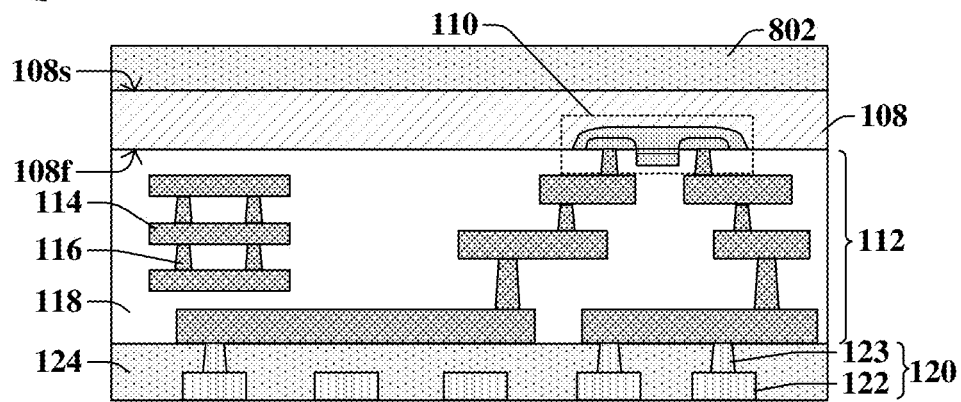

As shown in cross-sectional view 800 of FIG. 8, the semiconductor substrate 108 is flipped such that a backside 108*s* of the semiconductor substrate 108 may be processed. A first dielectric layer 802 may be deposited on the backside 108*s* of the semiconductor substrate 108. The first dielectric layer 802 may comprise a dielectric material, such as, for example, a nitride (e.g., silicon nitride, silicon oxynitride), a carbide (e.g., silicon carbide), an oxide (e.g., silicon oxide), borosilicate glass (BSG), phosphoric silicate glass (PSG), borophosphosilicate glass (BPSG), a low-k oxide (e.g., a carbon doped oxide, SiCOH), or the like. In some embodiments, the first dielectric layer 802 may comprise a same material as the bonding dielectric structure 124. The first dielectric layer 802 may be formed by way deposition processes (e.g., chemical vapor deposition (CVD), physical vapor deposition (PVD), atomic layer deposition (ALD), etc.). In some embodiments, the first dielectric layer 802 may have a thickness in a range of between, for example, approximately 2 kiloangstroms and approximately 4 kiloangstroms.

Figure 9:
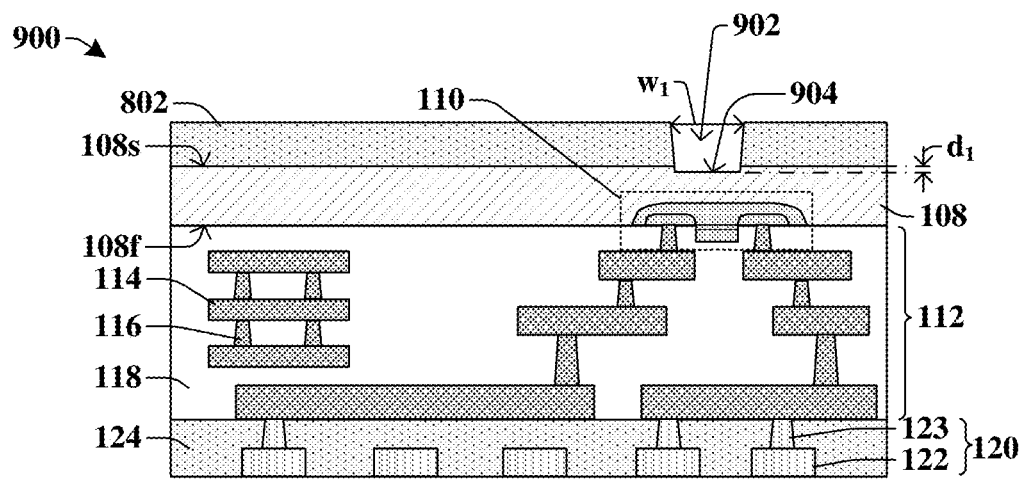

As shown in cross-sectional view 900 of FIG. 9, a first opening 902 may be formed that extends from the first dielectric layer 802 into the backside 108*s* of the semiconductor substrate 108. The first opening 902 may expose a first surface 904 of the semiconductor substrate 108, wherein the first surface 904 of the semiconductor substrate 108 is arranged below the backside 108*s* of the semiconductor substrate 108 by a first distance $d_1$. In some embodiments, the first distance $d_1$ may be in a range of between, for example, approximately 100 angstroms and approximately 700 angstroms. Further, in some embodiments, the first opening 902 has a first width $w_1$. In some embodiments, the first width $w_1$ is in a range of between, for example, approximately 1.5 micrometers and approximately 2.5 micrometers. It will be appreciated that other values for the first distance $d_1$ and the first width $w_1$ are also within the scope of the disclosure.

In some embodiments, the first opening 902 directly overlies the semiconductor device 110, but the first opening 902 does not expose any active areas of the semiconductor device 110. Thus, the first opening 902 is spaced apart from the semiconductor device 110 by the semiconductor substrate 108. In some embodiments, the first opening 902 may be formed through photolithography and removal (e.g., etching processes) processes. For example, in some embodiments, a masking structure (not shown) may be formed over the first dielectric layer 802, an opening may be formed in the masking structure by way of photolithography and removal processes, and then a removal process may be performed according to the opening in the masking structure to form the first opening 902 in the first dielectric layer 802 and the semiconductor substrate 108. In some embodiments, a dry etching process may be used to form the first opening 902, for example.

Figure 10:
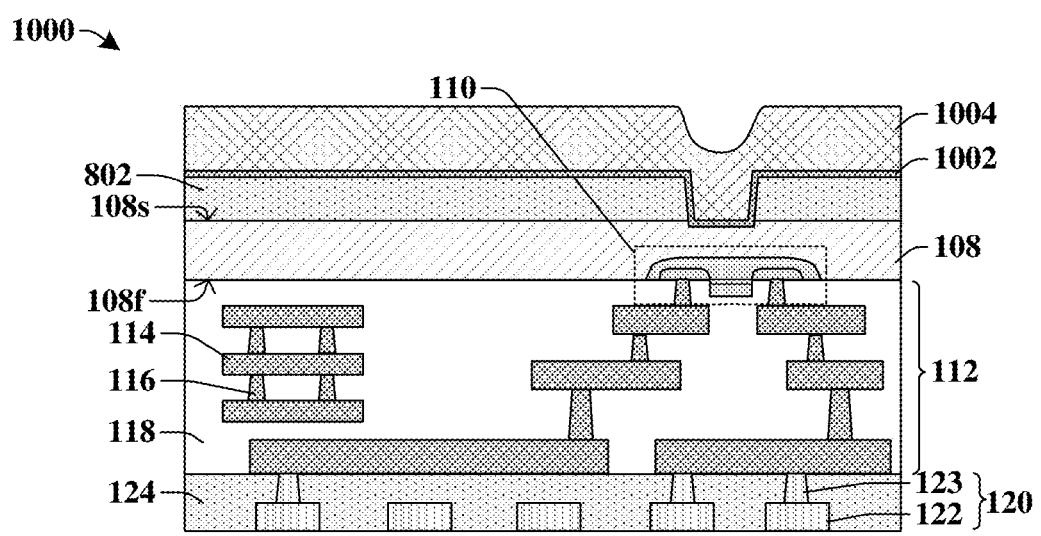

As shown in cross-sectional view 1000 of FIG. 10, a conformal glue layer 1002 and a first conductive material 1004 are formed over the first dielectric layer 802 and within the first opening (902 of FIG. 9). In some embodiments, the conformal glue layer 1002 comprises, for example, titanium or titanium nitride, and has a thickness in a range of between, for example, approximately 20 angstroms and approximately 300 angstroms. In some embodiments, the first conductive material 1004 comprises, for example, tungsten. The conformal glue layer 1002 and/or the first conductive material 1004 may be deposited by way of, for example, a deposition process (e.g., CVD, PE-CVD, PVD, ALD, sputtering, etc.).

Figure 11:
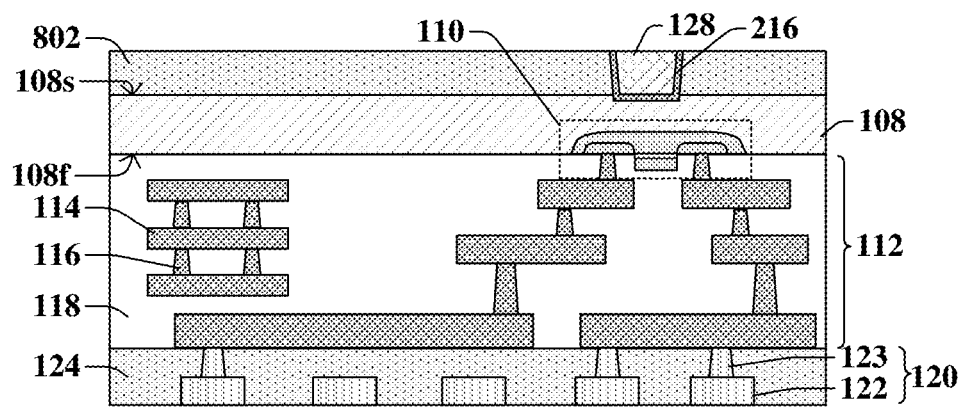

As shown in cross-sectional view 1100 of FIG. 11, the first conductive material (1004 of FIG. 10) and the conformal glue layer (1002 of FIG. 10) disposed over a topmost surface of the first dielectric layer 802 are removed, thereby forming a first backside contact 128 surrounded by a glue layer 216 and extending into the backside 108s of the semiconductor substrate 108. In some embodiments, the first conductive material (1004 of FIG. 10) and the conformal glue layer (1002 of FIG. 10) are removed by a planarization process (e.g., CMP), and thus, the first backside contact 128 may have a top surface that is substantially coplanar with the first dielectric layer 802. In some embodiments, the first backside contact 128 may have a height in a range of between, for example, approximately 0.1 micrometers and approximately 0.4 micrometers.

Figure 12:
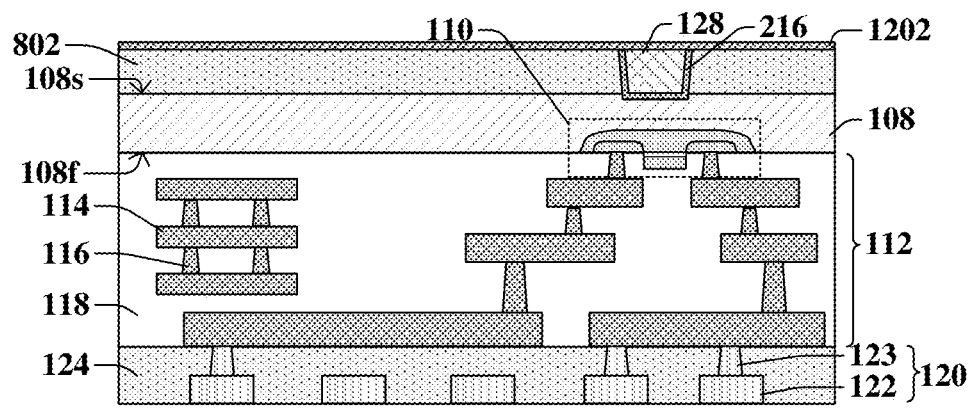

As shown in cross-sectional view 1200 of FIG. 12, a first etch stop layer 1202 may be formed over the first dielectric layer 802 and the first backside contact 128. In some embodiments, the first etch stop layer 1202 may comprise, for example, a nitride (e.g., silicon nitride), a carbide (e.g., silicon carbide), or the like. In some embodiments, the first etch stop layer 1102 may be deposited by way of, for example, a deposition process (e.g., CVD, PE-CVD, PVD, ALD, sputtering, etc.).

Figure 13:
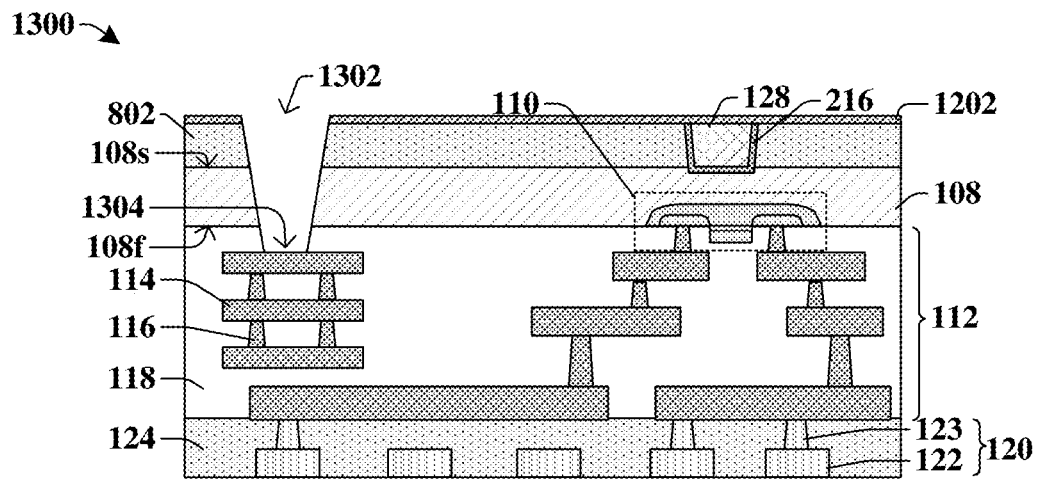

As shown in cross-sectional view 1300 of FIG. 13, a second opening 1302 may be formed that extends through the first etch stop layer 1202, the first dielectric layer 802, the semiconductor substrate 108, and a portion of the interconnect dielectric structure 118 to expose an upper surface 1304 of one of the interconnect wires 114. In some embodiments, the second opening 1302 may be formed through a selective patterning process by forming a masking structure through photolithography and performing a removal process (e.g., etching) to form the second opening 1302 according to the masking structure. The second opening 1302 is spaced from the semiconductor device 110 to avoid interfering with and/or damaging the semiconductor device 110. Thus, in some embodiments, the second opening 1302 is spaced apart from the first backside contact 128. Further, the first backside contact 128 remains covered by the first etch stop layer 1202 during the formation of the second opening 1302.

Figure 14:
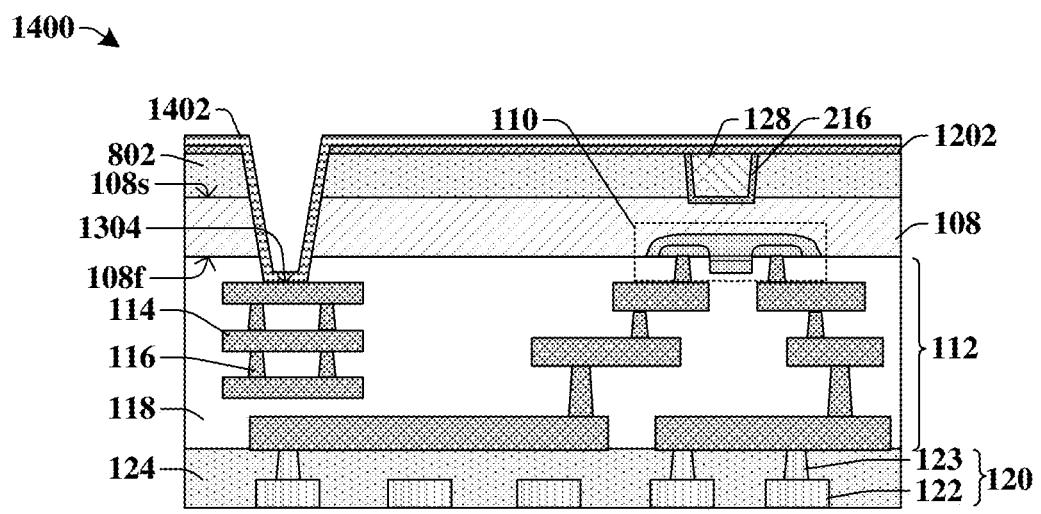

As shown in cross-sectional view 1400 of FIG. 14, an electrical insulator layer 1402 is deposited over the first etch stop layer 1202 and along surfaces of the second opening (1302 of FIG. 13) defined by inner sidewalls of the first dielectric layer 802 and the semiconductor substrate 108 and by the upper surface 1304 of one of the interconnect wires 114. In some embodiments, the electrical insulator layer 1402 may comprise, for example, silicon dioxide, silicon nitride, aluminum oxide, or some other electrical insulator material. In some embodiments, the electrical insulator layer 1402 may be deposited by way of a deposition process (e.g., CVD, PE-CVD, PVD, ALD, etc.). In some embodiments, the electrical insulator layer 1402 may have a thickness in a range of between, for example, approximately 200 angstroms and approximately 2000 angstroms.

Figure 15:
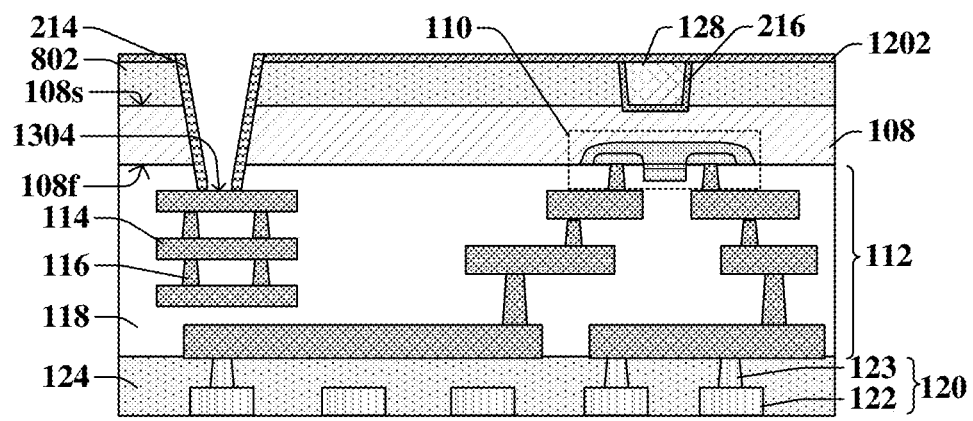
Figure 16:
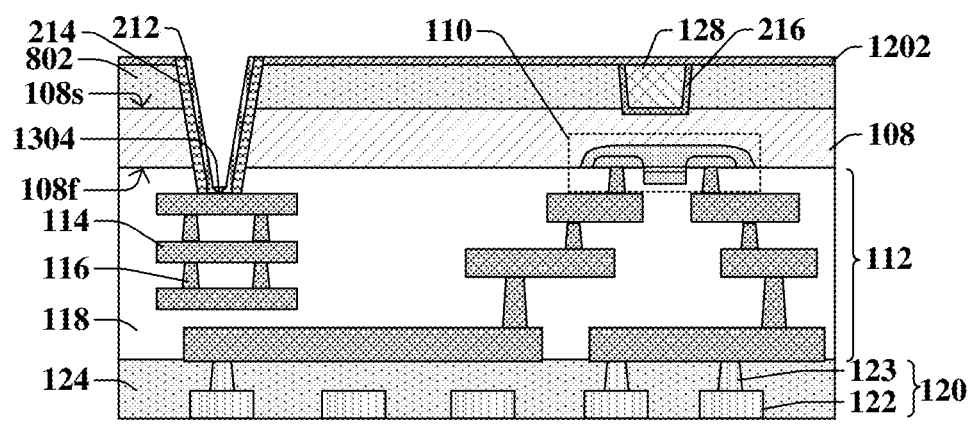

As shown in cross-sectional view 1500 of FIG. 15, horizontal portions of the electrical insulator layer (1402 of FIG. 14) are removed, thereby forming a TSV lining 214 within the second opening (1302 of FIG. 13) and covers inner sidewalls of the first dielectric layer 802, the semiconductor substrate 108, and portions of the interconnect dielectric structure 118. In some embodiments, the horizontal portions of the electrical insulator layer (1402 of FIG. 14) may be removed using a vertical etching process (e.g., vertical dry etch), such that a masking layer is not needed. The TSV lining 214 does not completely cover the upper surface 1304 of the one of the interconnect wires 114 after the vertical etching process, in some embodiments.

Figure 17:
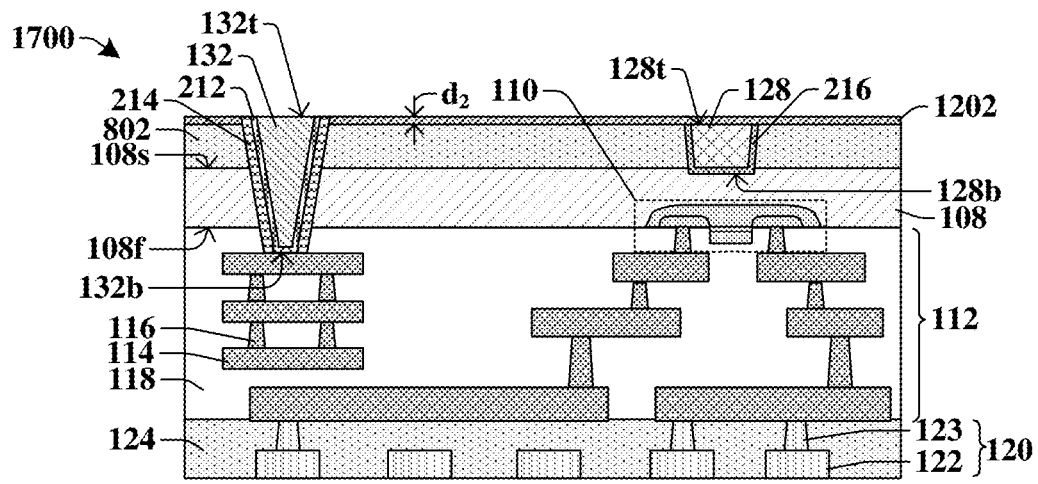

As shown in cross-sectional view 1700 of FIG. 17, the second opening (1302 of FIG. 13) is filled with a second conductive material to formed a TSV 132. In some embodiments, a chemical barrier layer 212 is deposited first in the second opening (1302 of FIG. 13) by way of, for example, a deposition process (e.g., CVD, PE-CVD, PVD, ALD, sputtering, etc.). The chemical barrier layer 212 may comprise, for example, tantalum or tantalum nitride and have a thickness in a range of between, for example, approximately 50 angstroms and approximately 500 angstroms. Then, in some embodiments, the second conductive material is formed over the chemical barrier layer 212 within the second opening (1302 of FIG. 13) by way of, for example, a deposition process (e.g., CVD, PE-CVD, PVD, ALD, sputtering, etc.). In some embodiments, the second conductive material, and thus the TSV 132 comprises, for example, copper. Then, in some embodiments, a planarization process (e.g., chemical mechanical planarization (CMP)) may be used to remove excess second conductive material and any excess material of the chemical barrier layer 212 that is arranged over the first etch stop layer 1202. Thus, the TSV 132 and the chemical barrier layer 212 have upper surfaces substantially coplanar with the first etch stop layer 1202. In some embodiments, the chemical barrier layer 212 may prevent the TSV 132 from diffusing in to the semiconductor substrate 108, and the TSV lining 214 may prevent any electrical signals traveling through the TSV 132 during operation from leaking into the semiconductor substrate 108. Thus, both the chemical barrier layer 212 and the TSV lining 214 prevent the TSV 132 from damaging and/or interfering with the semiconductor device 110. Further, the TSV 132 is electrically coupled to the interconnect structure 112. In some embodiments, the TSV 132 may have a height that is in a range of between, for example, approximately 0.7 micrometers and approximately 3.2 micrometers. Because the TSV 132 extends completely through the semiconductor substrate 108, the TSV 132 has a height that is greater than the thickness of the semiconductor substrate 108.

Further, because the TSV 132 is formed after the first backside contact 128, the topmost surface 132t of the TSV 132 is arranged above a topmost surface 128t of the first backside contact 128. In some embodiments, a bottommost surface 132b of the TSV 132 is also below a bottommost surface 128b of the first backside contact 128, Therefore, forming the first backside contact 128 to aid in thermal dissipation of generated heat away from the semiconductor device 110 during operation of the semiconductor device 110 does not increase the vertical dimensions of the overall device. In some embodiments, the difference in height between the topmost surface 132*t* of the TSV 132 and the topmost surface 128*t* of the first backside contact 128 is equal to a second distance $d_2$. In some embodiments, the second distance $d_2$ is equal to the thickness of the first etch stop layer 1202. Thus, in some embodiments, the second distance $d_2$ is in a range of between, for example, approximately 10 angstroms and approximately 8000 angstroms.

Figure 18:
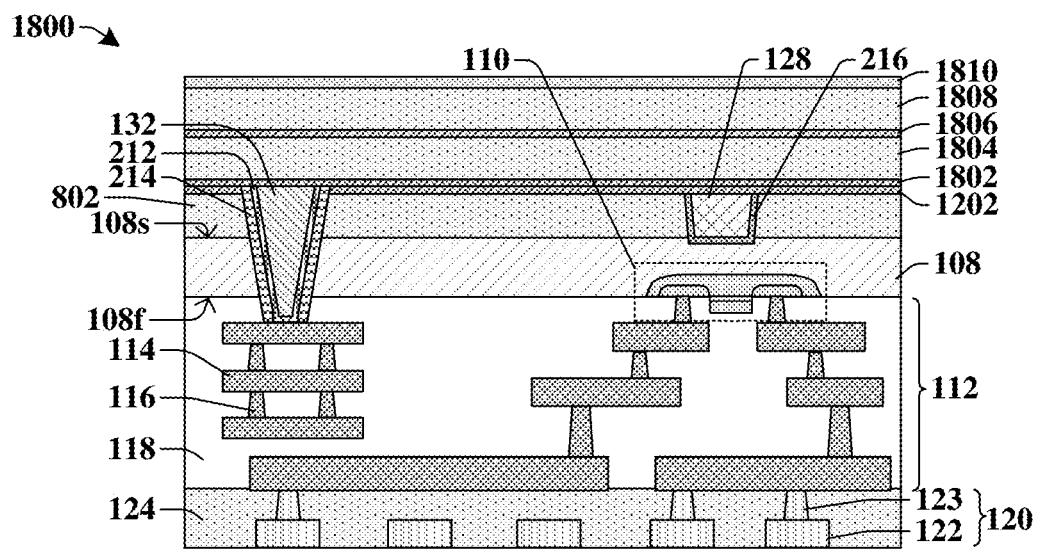

As shown in cross-sectional view 1800 of FIG. 18, in some embodiments, a second etch stop layer 1802 may be formed over the first etch stop layer 1202 and over the TSV 132. Further, multiple dielectric and/or etch stop layers may be formed over the first etch stop layer 1202. For example, in some embodiments, a second dielectric layer 1804 is formed over the second etch stop layer 1802; a third etch stop layer 1806 is formed over the second dielectric layer 1804; a third dielectric layer 1808 is formed over the third etch stop layer 1806; and a bonding dielectric layer 1810 is formed over the third dielectric layer 1808. In some embodiments, the second and third etch stop layers 1802, 1806 may comprise, for example, a nitride (e.g., silicon nitride), a carbide (e.g., silicon carbide), or the like; may be deposited by way of, for example, a deposition process (e.g., CVD, PE-CVD, PVD, ALD, sputtering, etc.); and may each have a thickness in a range of between approximately 500 angstroms and approximately 1000 angstroms, for example. Further, in some embodiments, the second and third dielectric layers 1804, 1808 and the bonding dielectric layer 1810 may comprise, for example, a dielectric material, such as, for example, a nitride (e.g., silicon nitride, silicon oxynitride), a carbide (e.g., silicon carbide), an oxide (e.g., silicon oxide), borosilicate glass (BSG), phosphoric silicate glass (PSG), borophosphosilicate glass (BPSG), a low-k oxide (e.g., a carbon doped oxide, SiCOH), or the like; may be deposited by way of, for example, a deposition process (e.g., CVD, PE-CVD, PVD, ALD, sputtering, etc.); and may each have a thickness in a range of between approximately 2 kiloangstroms and approximately 4 kiloangstroms for example. Further, in other embodiments, the bonding dielectric layer 1810 may have a thickness in a range of between, for example, approximately 10 angstroms and approximately 8000 angstroms.

Figure 19:
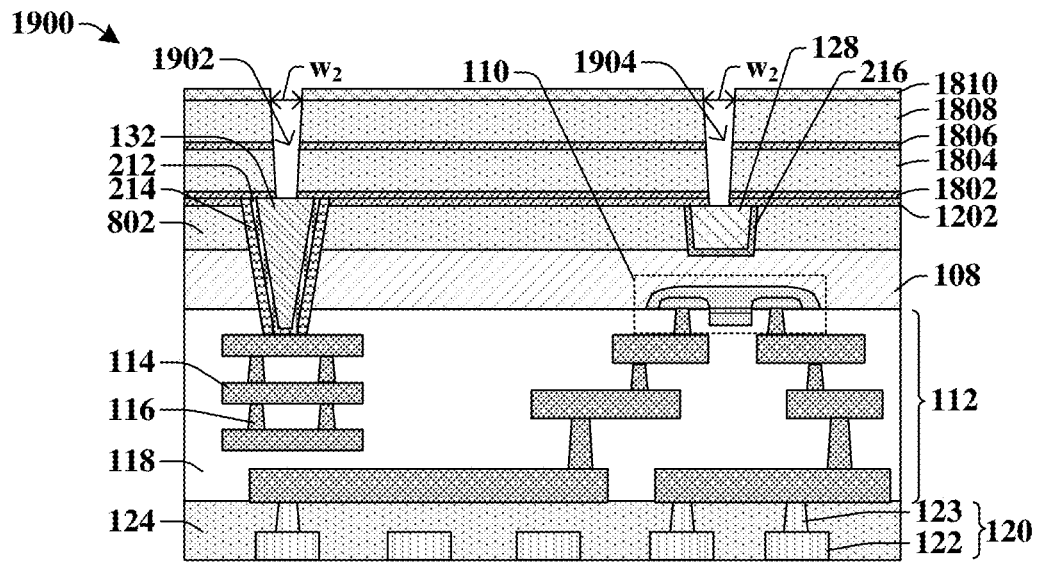

As shown in cross-sectional view 1900 of FIG. 19, a third opening 1902 and a fourth opening 1904 may be formed to expose the TSV 132 and the first backside contact 128, respectively. Thus, in some embodiments, the third opening 1902 may extend through the bonding dielectric layer 1810, the third dielectric layer 1808, the third etch stop layer 1806, the second dielectric layer 1804, and the second etch stop layer 1802 to expose the TSV 132. Thus, in some embodiments, the fourth opening 1904 may extend through the bonding dielectric layer 1810, the third dielectric layer 1808, the third etch stop layer 1806, the second dielectric layer 1804, the second etch stop layer 1802, and the first etch stop layer 1202 to expose the first backside contact 128. In such embodiments, the fourth opening 1904 extends through one more layer than the third opening 1902; for example, in some embodiments, the fourth opening 1904 extends through the first etch stop layer 1202, whereas the third opening 1902 does not extend through the first etch stop layer 1202. In some embodiments, the third opening 1902 and the fourth opening 1904 may be formed by a selective patterning process according to a masking structure using photolithography and removal (e.g., etching) processes. In some embodiments, the third and fourth openings 1902, 1904 each have a second width $w_2$.

Figure 20:
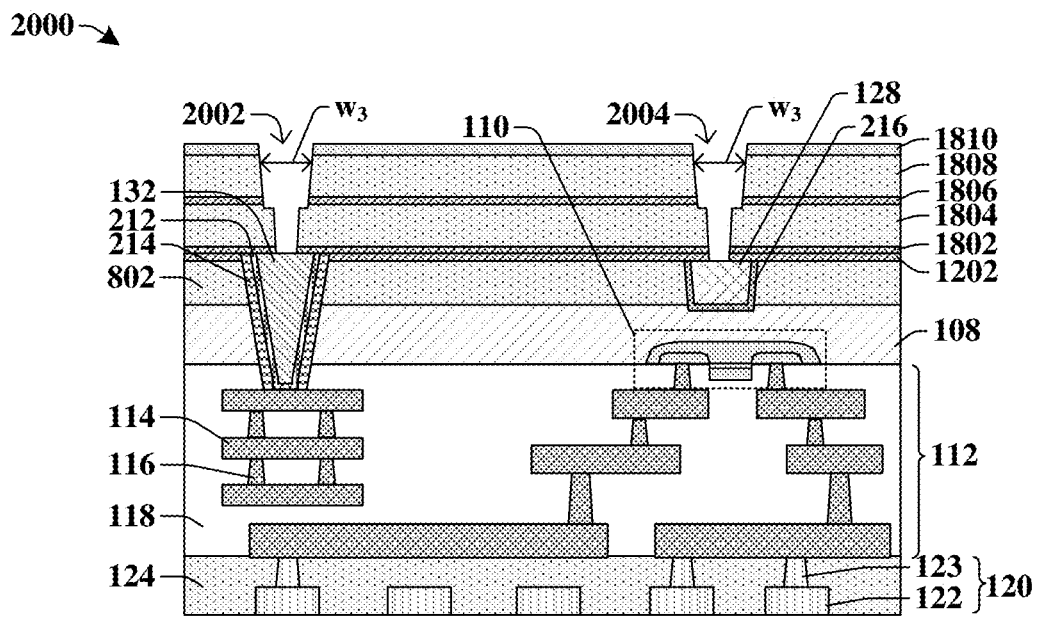

As shown in cross-sectional view 2000 of FIG. 20, in some embodiments, a fifth opening 2002 is formed over the third opening (1902 of FIG. 19), and a sixth opening 2004 is formed over the fourth opening (1904 of FIG. 19). In such embodiments, the fifth opening 2002 and the sixth opening 2004 may extend from the bonding dielectric layer 1810, the third dielectric layer 1808, and the third etch stop layer 1806. In some embodiments, the fifth opening 2002 and the sixth opening 2004 may also extend partially into the second dielectric layer 1804. The fifth opening 2002 and the sixth opening 2004 may directly overlie the third opening (1902 of FIG. 19) and the fourth opening (1904 of FIG. 19), respectively, in some embodiments. In some embodiments, the fifth opening 2002 and the sixth opening 2004 may be formed by a selective patterning process according to a masking structure using photolithography and removal (e.g., etching) processes. In some embodiments, the fifth and sixth openings 2002, 2004 each have a third width $w_3$ that is greater than the second width $w_2$. Thus, in some embodiments, the fifth and sixth openings 2002, 2004 essentially widen upper portions of the third and fourth openings (1902, 1904 of FIG. 19). In some other embodiments, to reduce manufacturing steps and thus, time and costs, the steps of FIG. 20 may be omitted. Thus, in some embodiments, the method may proceed from FIG. 19 to FIG. 21, thereby skipping FIG. 20.

Figure 21:
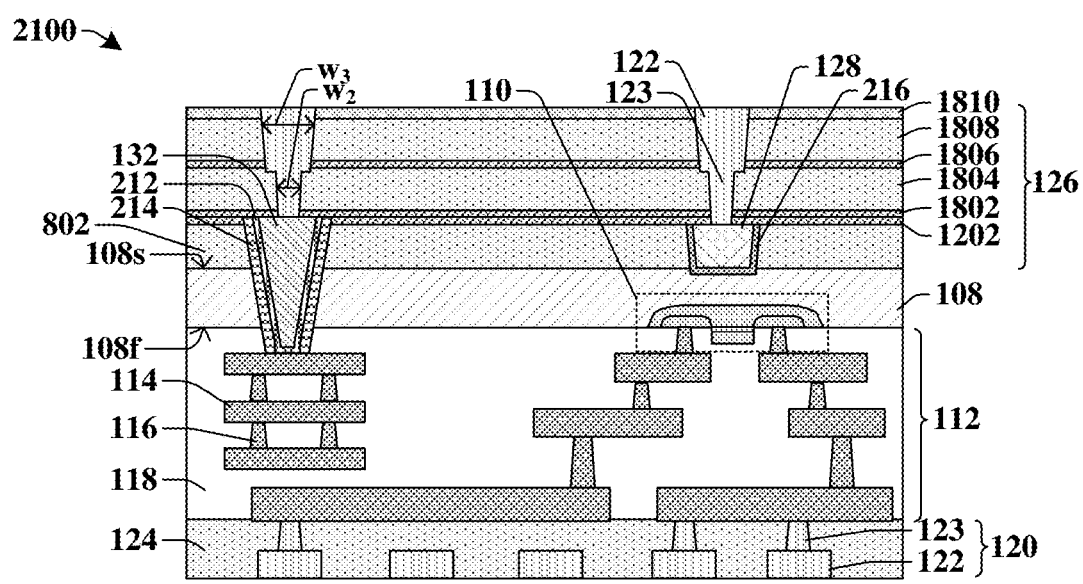

As shown in cross-sectional view 2100 of FIG. 21, a third conductive material is deposited into the openings (e.g., 1902 of FIG. 19, 1904 of FIG. 19, 2002 of FIG. 20, 2004 of FIG. 20) in the first etch stop layer 1202, the second etch stop layer 1802, the second dielectric layer 1804, the third etch stop layer 1806, the third dielectric layer 1808, and the bonding dielectric layer 1810 thereby forming bonding vias 123 and bonding wire layers 122 coupled to the TSV 132 and the first backside contact 128. In such embodiments, the bonding vias 123 and the bonding wire layers 122 embedded within the first etch stop layer 1202, the second etch stop layer 1802, the second dielectric layer 1804, the third etch stop layer 1806, the third dielectric layer 1808, and the bonding dielectric layer 1810 may form an additional bonding structure 126 arranged on the backside 108*s* of the semiconductor substrate 108. Further, in some embodiments, the first dielectric layer 802, the first etch stop layer 1202, the second etch stop layer 1802, the second dielectric layer 1804, the third etch stop layer 1806, the third dielectric layer 1808, and the bonding dielectric layer 1810 may be collectively referred to as a bonding dielectric structure of the additional bonding structure 126.

In some embodiments, the third conductive material, and thus the bonding vias 123 and the bonding wire layers 122 comprise copper or some other suitable conductive material. In some embodiments, the bonding vias 123 of the additional bonding structure 126 have the second width $w_2$, and the bonding wire layers 122 of the additional bonding structure 126 have the third width $w_3$. Further, in some embodiments, the bonding wire layers 122 and the bonding vias 123 of the additional bonding structure 126 are formed by depositing the third conductive material by way of a deposition process (e.g., CVD, PVD, PE-CVD, ALD, sputtering, etc.) and subsequently planarized by way of a planarization process (e.g., chemical mechanical planarization (CMP)). Thus, in some embodiments, the formation of the bonding vias 123 and the bonding wire layers 122 in the additional bonding structure 126 in FIGS. 19-21 may be representative of a dual damascene process. In some embodiments, the cross-sectional view 2100 of FIG. 21 illustrates a second IC die 104 configured to be bonding to other IC dies by way of the additional bonding structure 126 and the bonding structure 120.

Figure 22:
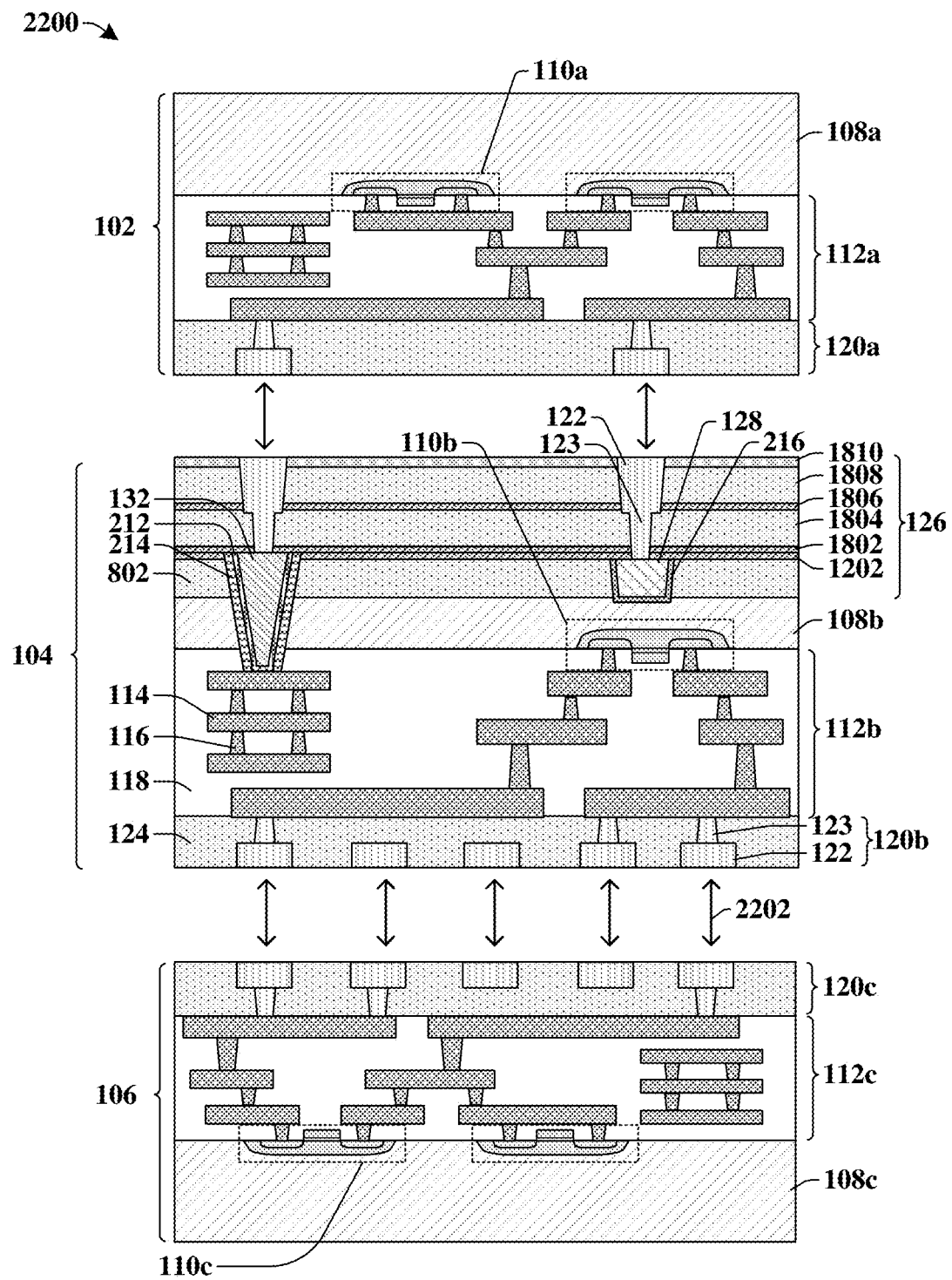

As shown in cross-sectional view 2200 of FIG. 22, in some embodiments, a bonding process 2202 may be conducted to form a 3D IC stack, wherein the second IC die 104 is bonded to a first IC die 102 through the additional bonding structure 126 and is bonded to a third IC die 106 through a second bonding structure 120b (120 of FIG. 21). In some embodiments, the first IC die 102 comprises a first substrate 108a, a first semiconductor device 110a arranged on the first substrate 108a, a first interconnect structure 112a arranged on the first substrate 108a, and a first bonding structure 120a arranged on the first interconnect structure 112a. In some embodiments, the first bonding structure 120a of the first IC die 102 may be bonded to the additional bonding structure 126 of the second IC die 104. Further, in some embodiments, the second IC die 104 may comprise a second substrate 108b (108 of FIG. 21) arranged between the additional bonding structure 126 and a second interconnect structure 112b (112 of FIG. 21), a second semiconductor device 110b (110 of FIG. 21) arranged on the second substrate 108b, and a second bonding structure 120b arranged on the second interconnect structure 112b. In some embodiments, the second bonding structure 120b of the second IC die 104 is bonded to a third bonding structure 120c of the third IC die 106. In some embodiments, the third IC die 106 may comprise a third substrate 108c, a third semiconductor device 110c arranged on the third substrate 108c, a third interconnect structure 112c arranged on the third substrate 108c, and the third bonding structure 120c arranged on the third interconnect structure 112c. In some embodiments, the bonding process 2202 may be or comprise a fusion bonding process, a eutectic bonding process, a metallic bonding process, and/or a combination thereof. Thus, in some embodiments, the bonding process 2202 may be a hybrid bonding process.

In some embodiments, a first and third substrates 108a, 108c of the first and third IC dies 102, 106 may each have a thickness in a range of between approximately 750 micrometers and approximately 800 micrometers. Thus, in some embodiments, the second substrate 108b of the second IC die 104 may be thinner than each of the first and third substrates 108a, 108c. In some embodiments, the TSV 132 extends completely through the second substrate 108b and may electrically couple the first IC die 102 to the second IC die 104. The first substrate 108a and the third substrate 108c may respectively define the lowermost and uppermost surfaces of the 3D IC stack. Thus, during operation of the 3D IC stack, any generated heat from the semiconductor devices (e.g., 110a, 110b, 110c) may dissipate away from the semiconductor devices (e.g., 110a, 110b, 110c) and exit the 3D IC stack through the first and third substrates 108a, 108c. Further, because of the first backside contact 128 in the second IC die 104, heat generated in the second substrate 108b may efficiently dissipate through the first backside contact 128 and towards the first and/or third substrates 108a, 108d through the bonding structures (e.g., 120a, 120b, 120c), the additional bonding structure 126, and/or the interconnect structures (e.g., 112a, 112b, 112c) to mitigate thermal damage to the semiconductor devices (e.g., 110a, 110b, 110c) without increasing the overall height of the second IC die 104, and thus, the overall 3D IC stack of FIG. 22.

Figure 23:
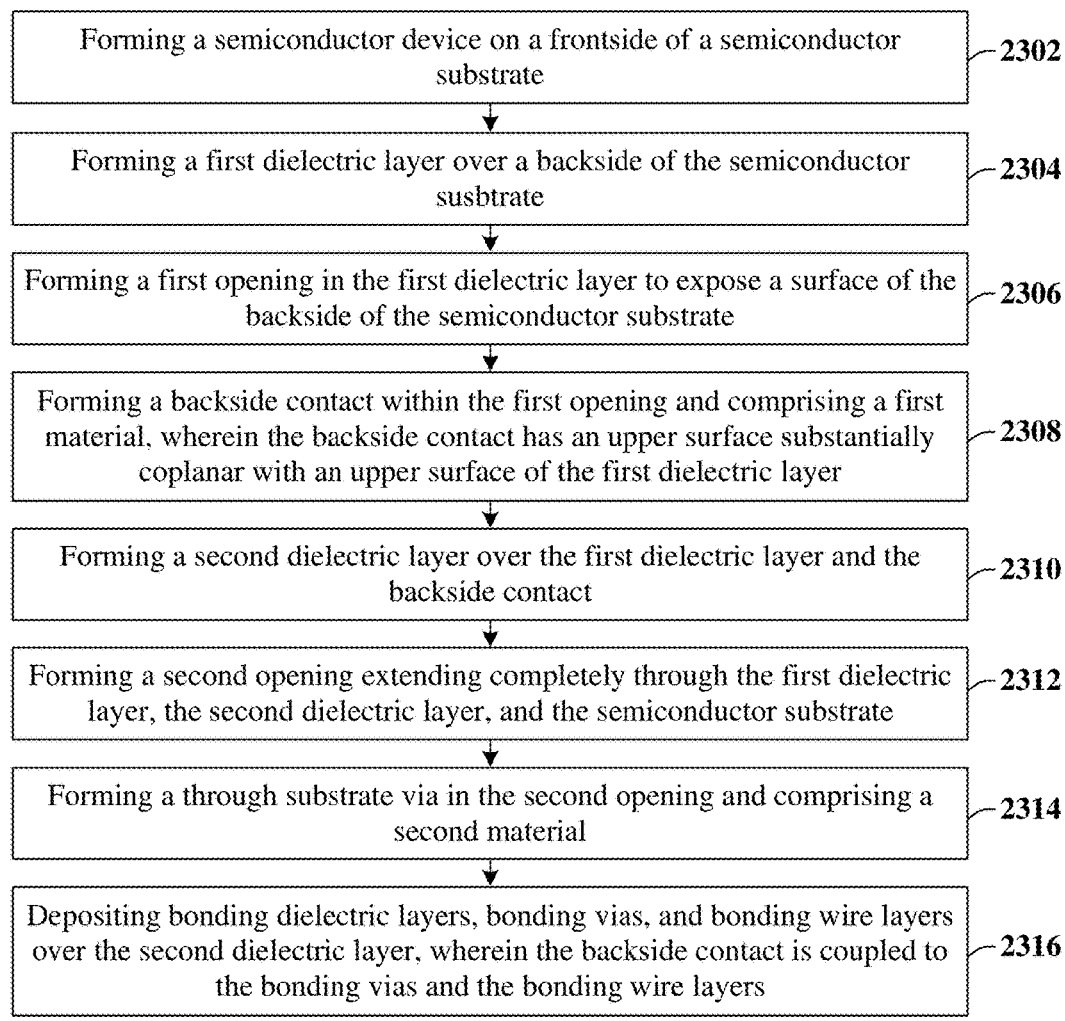
FIG. 23 illustrates a flow diagram of some embodiments of a method corresponding to the method illustrated in FIGS. 7-22.

FIG. 23 illustrates a flow diagram of some embodiments of a method 2300 corresponding to FIGS. 7-22.

While method 2300 is illustrated and described below as a series of acts or events, it will be appreciated that the illustrated ordering of such acts or events are not to be interpreted in a limiting sense. For example, some acts may occur in different orders and/or concurrently with other acts or events apart from those illustrated and/or described herein. In addition, not all illustrated acts may be required to implement one or more aspects or embodiments of the description herein. Further, one or more of the acts depicted herein may be carried out in one or more separate acts and/or phases.

At act 2302, a semiconductor device is formed on a frontside of a semiconductor substrate. FIG. 7 illustrates cross-sectional view 700 of some embodiments corresponding to act 2302.

At act 2304, a first dielectric layer is formed over a backside of the semiconductor substrate. FIG. 8 illustrates cross-sectional view 800 of some embodiments corresponding to act 2304.

At act 2306, a first opening in the first dielectric layer is formed to expose a surface of the backside of the semiconductor substrate. FIG. 9 illustrates cross-sectional view 900 of some embodiments corresponding to act 2306.

At act 2308, a backside contact is formed within the first opening and comprises a first material, wherein the backside contact has an upper surface substantially coplanar with an upper surface of the first dielectric layer. FIGS. 10 and 11 illustrate cross-sectional views 1000 and 1100, respectively, of some embodiments corresponding to act 2308.

At act 2310, a second dielectric layer is formed over the first dielectric layer and the backside contact. FIG. 12 illustrates cross-sectional view 1200 of some embodiments corresponding to act 2310.

At act 2312, a second opening is formed that extends completely through the first dielectric layer, the second dielectric layer, and the semiconductor substrate. FIG. 13 illustrates cross-sectional view 1300 of some embodiments corresponding to act 2312.

At act 2314, a through substrate via is formed in the second opening and comprises a second material. FIG. 17 illustrates cross-sectional view 1700 of some embodiments corresponding to act 2314.

At act 2316, bonding dielectric layers, bonding vias, bonding wire layers are deposited over the second dielectric layer, wherein the backside contact is coupled to the bonding vias and the bonding wire layers. FIGS. 18-21 illustrates cross-sectional views 1800-2100 of some embodiments corresponding to act 2316.

Therefore, the present disclosure relates to a method of forming a backside contact on a backside of a semiconductor substrate before a through substrate via such that the backside contact may aid in heat dissipation away from the semiconductor substrate without increasing dimensions of an overall 3D IC stack comprising the through substrate via and the backside contact.

Accordingly, in some embodiments, the present disclosure relates to a three-dimensional (3D) integrated circuit (IC) stack comprising: a first IC die comprising a first semiconductor substrate, a first interconnect structure arranged on a frontside of the first semiconductor substrate, and a first bonding structure arranged over the first interconnect structure; a second IC die comprising a second semiconductor substrate, a second interconnect structure arranged on a frontside of the second semiconductor substrate, and a second bonding structure arranged on a backside of the second semiconductor substrate, wherein the second bonding structure faces the first bonding structure; and a first backside contact extending from the second bonding structure to the backside of the second semiconductor substrate and is thermally coupled to at least one of the first interconnect structure or the second interconnect structure.

In other embodiments, the present disclosure relates to an integrated circuit (IC) die comprising: a semiconductor substrate; a semiconductor device integrated on a frontside of the semiconductor substrate; an interconnect structure arranged on the frontside of the semiconductor substrate, coupled to the semiconductor device, and comprising interconnect vias and interconnect wires embedded within dielectric layers; a first bonding structure arranged on the interconnect structure; a second bonding structure arranged on a backside of the semiconductor substrate and comprising bonding wire layers and bonding vias within a bonding dielectric structure; a backside contact arranged within the second bonding structure and coupled to the bonding wire layers and the bonding vias of the second bonding structure, wherein a bottommost surface of the backside contact is thermally coupled to the backside of the semiconductor substrate, wherein a topmost surface of the backside contact is arranged above a bottommost surface of the semiconductor substrate; and a through substrate via (TSV) extending through the semiconductor substrate and from the second bonding structure to the interconnect structure, wherein a topmost surface of the TSV is above the topmost surface of the backside contact.

In yet other embodiments, the present disclosure relates to a method of forming an integrated circuit, the method comprising: forming a semiconductor device on a frontside of a semiconductor substrate; depositing a first dielectric layer over a backside of the semiconductor substrate; patterning the first dielectric layer to form a first opening in the first dielectric layer, wherein the first opening exposes a surface of the backside of the semiconductor substrate; filling the first opening with a first material; performing a first removal process to remove the first material arranged over the first dielectric layer to form a backside contact comprising the first material in the first opening of the first dielectric layer; depositing a second dielectric layer over the first dielectric layer and the backside contact; patterning the second dielectric layer and the first dielectric layer to form a second opening that extends completely through the first dielectric layer, the second dielectric layer, and the semiconductor substrate; filling the second opening with a second material; performing a second removal process to form a through substrate via (TSV) comprising the second material in the second opening; and forming more dielectric layers, bonding vias, and bonding wire layers over the second dielectric layer to form a second bonding structure on the backside of the semiconductor substrate, wherein the backside contact is coupled to the bonding vias and the bonding wire layers.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A three-dimensional (3D) integrated circuit (IC) stack comprising:
   a first IC die comprising a first semiconductor substrate, a first interconnect structure, and a first bonding structure arranged over the first interconnect structure;
   a second IC die comprising a second semiconductor substrate, a second interconnect structure, and a second bonding structure arranged on the second semiconductor substrate, wherein the second bonding structure faces the first bonding structure;
   a first backside contact extending from the second bonding structure to the second semiconductor substrate and being thermally coupled to at least one of the first interconnect structure or the second interconnect structure; and
   a through substrate via (TSV) extending through the second semiconductor substrate, wherein the TSV is laterally spaced apart from the first backside contact, and wherein the TSV is not electrically coupled to the first backside contact.

2. The 3D IC stack of claim 1, wherein a topmost surface of the first backside contact is arranged below a topmost surface of the TSV, wherein a bottommost surface of the TSV is arranged below the bottommost surface of the first backside contact.

3. The 3D IC stack of claim 1, wherein the second IC die comprises a second semiconductor device arranged on the second semiconductor substrate, and wherein the first backside contact directly overlies the second semiconductor device.

4. The 3D IC stack of claim 1, wherein the first backside contact comprises tungsten, and wherein the first and second interconnect structures comprise copper.

5. The 3D IC stack of claim 1 further comprising:
   a third IC die comprising a third semiconductor substrate, a third interconnect structure arranged on a frontside of the third semiconductor substrate, and a third bonding structure arranged on the third interconnect structure, wherein the third bonding structure is arranged between the third semiconductor substrate and the second semiconductor substrate.

6. The 3D IC stack of claim 1, wherein the first backside contact has a higher thermal conductivity than the TSV.

7. An integrated circuit (IC) die comprising:
   a semiconductor substrate;
   an interconnect structure arranged on the semiconductor substrate, and comprising interconnect vias and interconnect wires embedded within dielectric layers;
   a first bonding structure arranged on the interconnect structure;
   a second bonding structure arranged beneath the semiconductor substrate and comprising bonding wire layers and bonding vias within a bonding dielectric structure;
   a contact arranged within the second bonding structure and coupled to the bonding wire layers and the bonding vias of the second bonding structure, wherein a first surface of the contact is thermally coupled to the semiconductor substrate, wherein a second surface of the contact is arranged below a bottommost surface of the semiconductor substrate; and
   a through substrate via (TSV) extending through the semiconductor substrate and from the second bonding structure to the interconnect structure, wherein a topmost surface of the TSV is above the topmost surface of the contact.

8. The IC die of claim 7, wherein the TSV is not electrically coupled to the contact.

9. The IC die of claim 8, wherein the contact has a higher thermal conductivity than the TSV.

10. The IC die of claim 7, wherein the contact and the TSV are coupled to a bond pad arranged within a third bonding structure bonded to the second bonding structure.

11. The IC die of claim 10, wherein the bond pad comprises aluminum.

12. The IC die of claim 7, wherein the contact has a higher thermal conductivity than the TSV.

13. The IC die of claim 7, wherein the TSV comprises copper and the contact comprises tungsten.

14. The IC die of claim 7, further comprising:
a glue layer separating the contact from the semiconductor substrate.

15. The IC die of claim 7 further comprising:
an additional contact arranged within the second bonding structure and coupled to the bonding wire layers and the bonding vias of the second bonding structure, wherein the additional contact is spaced apart from the contact by the semiconductor substrate.

16. A method of forming an integrated circuit, the method comprising:
depositing a first insulating layer over a first side of a semiconductor substrate;
forming a first opening in the first insulating layer to expose a portion of the first side of the semiconductor substrate;
forming a contact in the first opening;
depositing a second insulating layer over the first insulating layer and over the contact;
forming a second opening that extends completely through the first insulating layer, the second insulating layer, and the semiconductor substrate;
forming a through substrate via (TSV) in the second opening; and
forming additional insulating layers, bonding vias, and bonding wire layers over the second insulating layer to form a second bonding structure on the first side of the semiconductor substrate, wherein the contact is coupled to the bonding vias and the bonding wire layers.

17. The method of claim 16, wherein the forming of the contact is performed before the forming of the TSV.

18. The method of claim 16, wherein the contact has a higher thermal conductivity than the TSV.

19. The method of claim 16, wherein the TSV has a topmost surface that is above a topmost surface of the contact when the first side of the semiconductor substrate is above a second side of the semiconductor substrate.

20. The method of claim 19, wherein the topmost surface of the TSV is above the topmost surface of the contact by a first distance, and wherein the first distance is equal to a thickness of the second insulating layer.

* * * * *